(12) United States Patent
Sung

(10) Patent No.: US 7,235,912 B2
(45) Date of Patent: Jun. 26, 2007

(54) DIAMOND-LIKE CARBON THERMOELECTRIC CONVERSION DEVICES AND METHODS FOR THE USE AND MANUFACTURE THEREOF

(76) Inventor: Chien-Min Sung, No. 4, Lane 32, Chung-Cheng Road, Tansui, Taipei County 251 (TW)

( * ) Notice: Subject to any disclaimer, the term of this patent is extended or adjusted under 35 U.S.C. 154(b) by 0 days.

(21) Appl. No.: 11/157,179

(22) Filed: Jun. 20, 2005

(65) Prior Publication Data
US 2005/0275330 A1    Dec. 15, 2005

Related U.S. Application Data

(63) Continuation-in-part of application No. 11/112,724, filed on Apr. 21, 2005, now abandoned, which is a continuation-in-part of application No. 11/045,016, filed on Jan. 26, 2005, which is a continuation-in-part of application No. 10/460,052, filed on Jun. 11, 2003, now Pat. No. 6,949,873, which is a continuation-in-part of application No. 10/094,426, filed on Mar. 8, 2002, now Pat. No. 6,806,629.

(51) Int. Cl.
*H01L 35/12* (2006.01)
(52) U.S. Cl. .................................. 310/306; 136/200
(58) Field of Classification Search ................ 313/311; 136/200, 236.1; 429/209; 310/306
See application file for complete search history.

(56) References Cited

U.S. PATENT DOCUMENTS 2,817,783 A    12/1957   Loebner 3,242,368 A    3/1966   Donald et al.

(Continued)

FOREIGN PATENT DOCUMENTS

WO    WO01/39235 A2    5/2001

OTHER PUBLICATIONS

Huth, Palle Von, James E. Butler, Wolfram Jaegermann and Reshef Tenne, "New Measurements on the Diamond/CdTe Solar Cell," Proceedings of the 13$^{th}$ Workshop on Quantum Solar Energy Conversion—(quantsol 2001), Mar. 11-17, 2001, Tirol, Österreich.

(Continued)

*Primary Examiner*—Mariceli Santiago
*Assistant Examiner*—Christopher Raabe
(74) *Attorney, Agent, or Firm*—Thorpe North & Western LLP

(57) ABSTRACT

Diamond-like carbon based thermoelectric conversion devices and methods of making and using the same which have improved conversion efficiencies and increased reliability. The device can include a cathode having a base member with a layer of diamond-like carbon material such as amorphous diamond coated over the cathode. A dielectric intermediate member can be electrically coupled between the diamond-like carbon material and an anode. Various additional layers and configurations can allow for improved performance such as multiple cathode layers and/or multiple intermediate layers. The thermoelectric conversion devices can be configured as an electrical generator and/or a cooling device and can be conveniently formed. In addition, the devices of the present invention do not require formation of a vacuum space and are typically completely solid throughout. As a result, the devices of the present invention are susceptible of mass production at reduced costs and have improved conversion efficiencies and reliability.

23 Claims, 7 Drawing Sheets

U.S. PATENT DOCUMENTS

| | | |
|---|---|---|
| 3,353,114 A | 11/1967 | Hanks et al. |
| 3,541,375 A | 11/1970 | Aven |
| 4,448,799 A | 5/1984 | Bergman et al. |
| 4,511,593 A | 4/1985 | Brandolf |
| 4,556,471 A | 12/1985 | Bergman et al. |
| 4,571,447 A | 2/1986 | Prins |
| 4,620,913 A | 11/1986 | Bergman |
| 4,622,452 A | 11/1986 | Bergman et al. |
| 4,640,744 A | 2/1987 | Howe |
| 5,028,546 A | 7/1991 | Hotchkiss |
| 5,284,525 A | 2/1994 | Saito et al. |
| 5,294,322 A | 3/1994 | Vetter et al. |
| 5,458,754 A | 10/1995 | Sathrum et al. |
| 5,487,790 A * | 1/1996 | Yasuda ............... 136/200 |
| 5,562,781 A | 10/1996 | Ingram et al. |
| 5,614,353 A | 3/1997 | Kumar et al. |
| 5,675,972 A | 10/1997 | Edelson |
| 5,679,895 A | 10/1997 | von Windheim |
| 5,712,488 A | 1/1998 | Stickel et al. |
| 5,713,775 A | 2/1998 | Geis et al. |
| 5,722,242 A | 3/1998 | Edelson |
| 5,777,427 A | 7/1998 | Tanaka et al. |
| 5,874,039 A | 2/1999 | Edelson |
| 5,959,400 A | 9/1999 | Niigaki et al. |
| 5,981,071 A | 11/1999 | Cox |
| 5,984,752 A | 11/1999 | Tanaka et al. |
| 5,994,638 A | 11/1999 | Edelson |
| 6,039,471 A | 3/2000 | Wyland |
| 6,055,815 A | 5/2000 | Peterson |
| 6,064,137 A | 5/2000 | Cox |
| 6,066,399 A | 5/2000 | Hirano et al. |
| 6,103,142 A | 8/2000 | Itoh et al. |
| 6,103,298 A | 8/2000 | Edelson et al. |
| 6,132,278 A | 10/2000 | Kang et al. |
| 6,139,964 A | 10/2000 | Sathrum et al. |
| 6,204,595 B1 | 3/2001 | Falabella |
| 6,214,651 B1 | 4/2001 | Cox |
| 6,229,083 B1 | 5/2001 | Edelson |
| 6,278,231 B1 | 8/2001 | Iwasaki et al. |
| 6,455,989 B1 | 9/2002 | Nakada et al. |
| 6,456,002 B1 | 9/2002 | Klinedinst et al. |
| 6,509,058 B2 | 1/2003 | Klinedinst et al. |
| 6,580,223 B2 | 6/2003 | Konishi et al. |
| 6,639,354 B1 | 10/2003 | Kojima et al. |
| 6,720,704 B1 * | 4/2004 | Tavkhelidze et al. ....... 310/306 |
| 6,819,041 B2 | 11/2004 | Kajiwara |

OTHER PUBLICATIONS

Pearce, S.R.J. et al., "Production of nanocrystalline diamond by laser ablation at the solid/liquid interface," Diamond and Related Materials, 2004, vol. 13, pp. 661-665.

Snyder, Jeffrey G. et al., "Using the compatibility factor to design high efficiency segmented thermoelectric generators," MRS Proceedings, 2003, vol. 793, start p. 37.

Rubarth, Boris et al., Amorphous carbon (a-C:H): a mono-elemental CerMet, Quantsol 2001, 13 Workshop on Quantum Solar Energy Conversion, Kirchberg, Mar. 10-17, 2001, pp. 1-2.

* cited by examiner

DIAMOND-LIKE CARBON THERMOELECTRIC CONVERSION DEVICES AND METHODS FOR THE USE AND MANUFACTURE THEREOF

PRIORITY DATA

This application is a continuation-in-part of U.S. patent application Ser. No. 11/112,724, filed on Apr. 21, 2005 now abandoned, which is a continuation-in-part of U.S. patent application Ser. No. 11/045,016, filed on Jan. 26, 2005, which is a continuation-in-part of U.S. patent application Ser. No. 10/460,052, filed on Jun. 11, 2003 now U.S. Pat. No. 6,949,873, which is a continuation-in-part of U.S. patent application Ser. No. 10/094,426, filed on Mar. 8, 2002, now issued as U.S. Pat. No. 6,806,629, each of which are incorporated herein by reference.

FIELD OF THE INVENTION

The present invention relates generally to devices and methods for generating electrons from diamond-like carbon material, and to devices and methods that utilize electrons generated by diamond-like carbon material. Accordingly, the present application involves the fields of physics, chemistry, electricity, and material science.

BACKGROUND OF THE INVENTION

Thermionic and field emission devices are well known and used in a variety of applications. Field emission devices such as cathode ray tubes and field emission displays are common examples of such devices. Generally, thermionic electron emission devices operate by ejecting hot electrons over a potential barrier, while field emission devices operate by causing electrons to tunnel through a barrier. Examples of specific devices include those disclosed in U.S. Pat. Nos. 6,229,083; 6,204,595; 6,103,298; 6,064,137; 6,055,815; 6,039,471; 5,994,638; 5,984,752; 5,981,071; 5,874,039; 5,777,427; 5,722,242; 5,713,775; 5,712,488; 5,675,972; and 5,562,781, each of which is incorporated herein by reference.

The electron emission properties of thermionic devices are more highly temperature dependent than in field emission devices. An increase in temperature can dramatically affect the number of electrons which are emitted from thermionic device surfaces.

Although basically successful in many applications, thermionic devices have been less successful than field emission devices, as field emission devices generally achieve a higher current output. Despite this key advantage, most field emission devices suffer from a variety of other shortcomings that limit their potential uses, including materials limitations, versatility limitations, cost effectiveness, lifespan limitations, and efficiency limitations, among others.

A variety of different materials have been used in field emitters in an effort to remedy the above-recited shortcomings, and to achieve higher current outputs using lower energy inputs. One material that has recently become of significant interest for its physical properties is diamond. Specifically, pure diamond has a low positive electron affinity which is close to vacuum. Similarly, diamond doped with a low ionization potential element, such as cesium, has a negative electron affinity (NEA) that allows electrons held in its orbitals to be shaken therefrom with minimal energy input. However, diamond also has a high band gap that makes it an insulator and prevents electrons from moving through, or out of it. A number of attempts have been made to modify or lower the band gap, such as doping the diamond with a variety of dopants, and forming it into certain geometric configurations. While such attempts have achieved moderate success, a number of limitations on performance, efficiency, and cost, still exist. Therefore, the possible applications for field emitters remain limited to small scale, low current output applications.

As such, materials capable of achieving high current outputs by absorbing relatively low amounts of energy from an energy source, and which are suitable for use in practical applications continue to be sought through ongoing research and development efforts.

SUMMARY OF THE INVENTION

Accordingly, the present invention provides materials, devices, and methods for conversion of energy using a thermoelectric conversion device. In one aspect, the present invention provides a diamond-like carbon thermoelectric conversion device having improved conversion efficiencies and increased reliability. The device can include a cathode having a base member with a layer of diamond-like carbon material coated over at least a portion thereof. A dielectric intermediate member can be electrically coupled to the diamond-like carbon material. An anode can also be electrically coupled to the intermediate member opposite the diamond-like carbon material.

In one alternative aspect, the base member of the cathode can include a plurality of layers which are configured to improve efficiency of electron emission from the diamond-like carbon material. Typically, a second layer of the base member can have a work function less than a work function of a first conductive cathode layer.

In another detailed aspect, the dielectric intermediate material can be a polymer, a glass, a ceramic, or a mixture or composite thereof. Almost any material which is useful as a capacitive material can be used; however, dielectric materials which are piezoelectric can be particularly useful. Non-limiting examples of suitable dielectric materials can include $BaTiO_3$, PZT, $Ta_2O_3$, PET, $PbZrO_3$, $PbTiO_3$, NaCl, LiF, MgO, $TiO_2$, $Al_2O_3$, BaO, KCl, $Mg_2SO_4$, fused silica glass, soda lime silica glass, high lead glass, and mixtures or combinations thereof. Materials suitable for the intermediate member can also include graphite and combinations of graphite and other materials such as ceramics and other dielectric materials.

In yet another detailed aspect, the cathode and the anode can be flexible such that the thermoelectric conversion device can be placed on contoured surfaces or used in applications where flexibility is required.

The thermoelectric conversion devices of the present invention can be configured as either, or both, an electrical generator and cooling device. In one aspect, an energy collector can be coupled to the cathode opposite the diamond-like carbon material such that the diamond-like carbon thermoelectric conversion device is configured as an electrical generator. This embodiment can operate under conversion of thermal and/or photonic energy into electrical energy. Alternatively, or in addition to an electrical generator, a voltage source can be operatively connected between the anode and the cathode such that the diamond-like carbon thermoelectric conversion device is configured as a cooling device. In this way, the device can selectively control heat flow across the device to cool an adjacent structure or space.

The thermoelectric conversion devices of the present invention can be conveniently formed using various techniques such as vapor deposition. In addition, the devices of the present invention do not require formation of a vacuum space and are typically completely solid throughout. As a result, the devices of the present invention are capable of mass production at reduced costs and are highly robust and reliable for an extended period of time.

In an alternative aspect, the devices of the present invention can be subjected to a heat treatment to consolidate interfacial boundaries and reduce material defects.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

The drawings will be described further in connection with the following detailed description. Further, these drawings are not necessarily to scale and are by way of illustration only such that dimensions and geometries can vary from those illustrated.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an," and "the" include plural referents unless the context clearly dictates otherwise. Thus, for example, reference to "a layer" includes one or more of such layers, reference to "a carbon source" includes reference to one or more of such carbon sources, and reference to "a cathodic arc technique" includes reference to one or more of such techniques.

Definitions

In describing and claiming the present invention, the following terminology will be used in accordance with the definitions set forth below.

As used herein, "vacuum" refers to a pressure condition of less than $10^{-2}$ torr.

Figure 6:
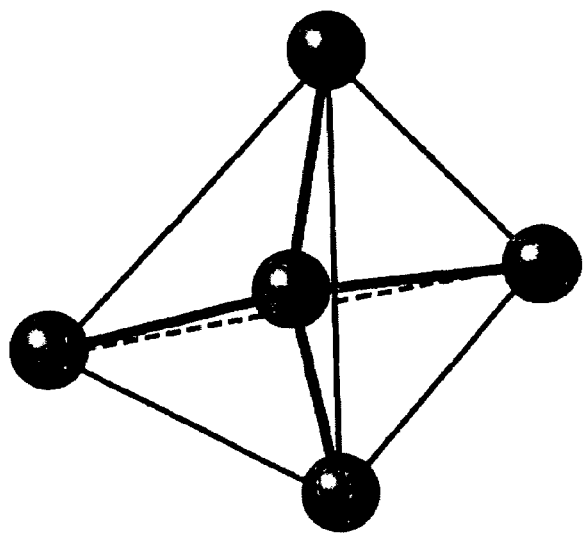
FIG. 6 shows a perspective view of a diamond tetrahedron having regular or normal tetrahedron coordination of carbon bonds.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. A representation of carbon atoms bonded in a normal or regular tetrahedron configuration in order to form diamond is shown in FIG. 6. The structure and nature of diamond, including its physical and electrical properties are well known in the art.

Figure 7:
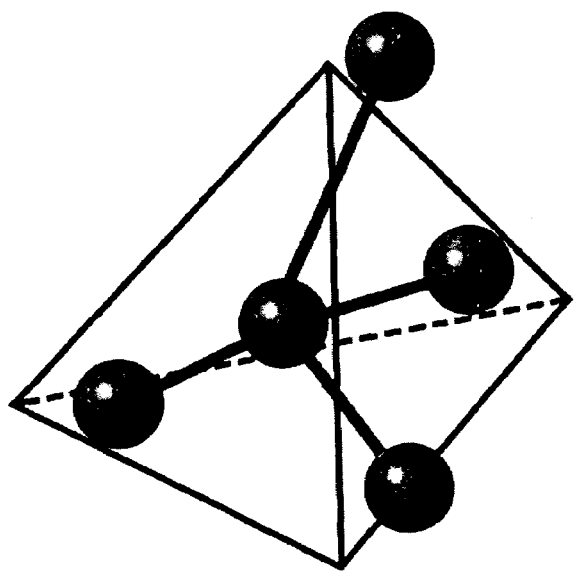
FIG. 7 shows a perspective view of a carbon tetrahedron having irregular, or abnormal tetrahedron coordination of carbon bonds.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond. A representation of carbon atoms bonded in distorted tetrahedral coordination is shown in FIG. 7. It will be understood that FIG. 7 is a representation of merely one possible distorted tetrahedral configuration and a wide variety of distorted configurations are generally present in amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

As used herein, "vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), metal-organic CVD (MOCVD), sputtering, thermal evaporation PVD, ionized metal PVD (IMPVD), electron beam PVD (EBPVD), reactive PVD, atomic layer deposition (ALD) and the like.

As used herein, "asperity" refers to the roughness of a surface as assessed by various characteristics of the surface anatomy. Various measurements may be used as an indicator of surface asperity, such as the height of peaks or projections thereon, and the depth of valleys or concavities depressing therein. Further, measures of asperity include the number of peaks or valleys within a given area of the surface (i.e. peak or valley density), and the distance between such peaks or valleys.

As used herein, "metallic" refers to a metal, or an alloy of two or more metals. A wide variety of metallic materials are known to those skilled in the art, such as aluminum, copper, chromium, iron, steel, stainless steel, titanium, tungsten, zinc, zirconium, molybdenum, etc., including alloys and compounds thereof.

As used herein, "electron affinity" refers to the tendency of an atom to attract or bind a free electron into one of its orbitals. Further, "negative electron affinity" (NEA) refers to the tendency of an atom to either repulse free electrons, or to allow the release of electrons from its orbitals using a small energy input. NEA is generally the energy difference between a vacuum and the lowest energy state within the conduction band. Those of ordinary skill in the art will recognize that negative electron affinity may be imparted by the compositional nature of the material, or the crystal irregularities, e.g. defects, inclusions, grain boundaries, twin planes, or a combination thereof.

As used herein, "dielectric" refers to any material which is electrically resistive. Dielectric materials can include any number of types of materials such as, but not limited to, glass, polymers, ceramics, graphites, alkaline and alkali earth metal salts, and combinations or composites thereof.

As used herein, "work function" refers to the amount of energy, typically expressed in eV, required to cause electrons in the highest energy state of a material to emit from the material into a vacuum space. Thus, a material such as copper having a work function of about 4.5 eV would require 4.5 eV of energy in order for electrons to be released from the surface into a theoretical perfect vacuum at 0 eV.

As used herein, "electrically coupled" refers to a relationship between structures that allows electrical current to flow at least partially between them. This definition is intended to include aspects where the structures are in physical contact and those aspects where the structures are not in physical contact. Typically, two materials which are electrically coupled can have an electrical potential or actual current between the two materials. For example, two plates physically connected together by a resistor are in physical contact, and thus allow electrical current to flow between them. Conversely, two plates separated by a dielectric material are not in physical contact, but, when connected to an alternating current source, allow electrical current to flow between them by capacitive means. Moreover, depending on the insulative nature of the dielectric material, electrons may be allowed to bore through, or jump across the dielectric material when enough energy is applied.

As used herein, "thermoelectric conversion" relates to the conversion of thermal energy to electrical energy or of electrical energy to thermal energy, or flow of thermal energy. Further, in context of the present invention, diamond-like carbon typically operates under thermionic emission. As discussed elsewhere herein, thermionic emission is a property wherein increased electron emission is achieved from a material with increases in temperatures. Diamond-like materials such as amorphous diamond exhibit thermionic emission at temperatures far below that of most materials. For example, many materials tend to exhibit substantial thermionic emission or temperature related effects in emission properties at temperatures over about 1100° C. In contrast, amorphous diamond exhibits increases in emission at temperature changes near room temperature up to 1000° C. or more. Thus, thermionic materials such as amorphous diamond can be useful at temperatures from below room temperature to about 300° C.

As used herein, "electrical generator" refers to thermoelectric conversion devices which are used and configured in a manner to produce electricity.

As used herein, "cooling device" refers to a thermoelectric conversion device which is configured to control heat transfer across the device as a result of an applied voltage.

As used herein, "substantial" when used in reference to a quantity or amount of a material, or a specific characteristic thereof, refers to an amount that is sufficient to provide an effect that the material or characteristic was intended to provide. The exact degree of deviation allowable may in some cases depend on the specific context. Similarly, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 micron to about 5 microns" should be interpreted to include not only the explicitly recited values of about 1 micron to about 5 microns, but also include individual values and sub-ranges within the indicated range. Thus, included in this numerical range are individual values such as 2, 3, and 4 and sub-ranges such as from 1–3, from 2–4, and from 3–5, etc.

This same principle applies to ranges reciting only one numerical value. Furthermore, such an interpretation should apply regardless of the breadth of the range or the characteristics being described.

The Invention

The present invention involves an amorphous diamond material that can be used to generate electrons upon input of a sufficient amount of energy. As recited in the background section, utilization of a number of materials have been attempted for this purpose, including the diamond materials and devices disclosed in WO 01/39235, which is incorporated herein by reference. Due to its high band gap properties, diamond is unsuitable for use as an electron emitter unless modified to reduce or alter the band gap. Thus far, the techniques for altering diamond band gap, such as doping the diamond with various dopants, and configuring the diamond with certain geometric aspects have yielded electron emitters of questionable use.

It has now been found that various diamond-like carbon materials can easily emit electrons when an energy source is applied. Such materials retain the NEA properties of diamond, but do not suffer from the band gap issues of pure diamond. Thus, electrons energized by applied energy are allowed to move readily through the diamond-like carbon material, and be emitted using significantly lower energy inputs, than those required by diamond. Further, the diamond-like carbon material of the present invention has been found to have a high energy absorption range, allowing for a wider range of energies to be converted into electrons, and thus increasing the conversion efficiency.

A variety of specific diamond-like carbon materials that provide the desired qualities are encompassed by the present invention. In one specific embodiment, the diamond-like carbon material can be amorphous diamond material. One aspect of the amorphous diamond material that facilitates electron emission is the distorted tetrahedral coordination with which many of the carbon atoms are bonded. Tetrahedral coordination allows carbon atoms to retain the $sp^3$ bonding characteristic that may facilitate the surface condition required for NEA, and also provides a plurality of effective band gaps, due to the differing bond lengths of the carbon atom bonds in the distorted tetrahedral configuration. In this manner, the band gap issues of pure diamond are overcome, and the amorphous diamond material becomes effective for emitting electrons. In one aspect of the present invention, the amorphous diamond material can contain at least about 90% carbon atoms with at least about 20% of such carbon atoms being bonded with distorted tetrahedral coordination. In another aspect, the amorphous diamond can have at least about 95% carbon atoms with a least about 30% of such carbon atoms being bonded with distorted tetrahedral coordination. In another aspect, the amorphous diamond can have at least about 80% carbon atoms with at least about 20%, and more preferably at least about 30%, of such carbon atoms being bonded with distorted tetrahedral coordination. In yet another aspect, the amorphous diamond can have at least 50% of the carbon atoms bonded in distorted tetrahedral coordination.

Figure 1:
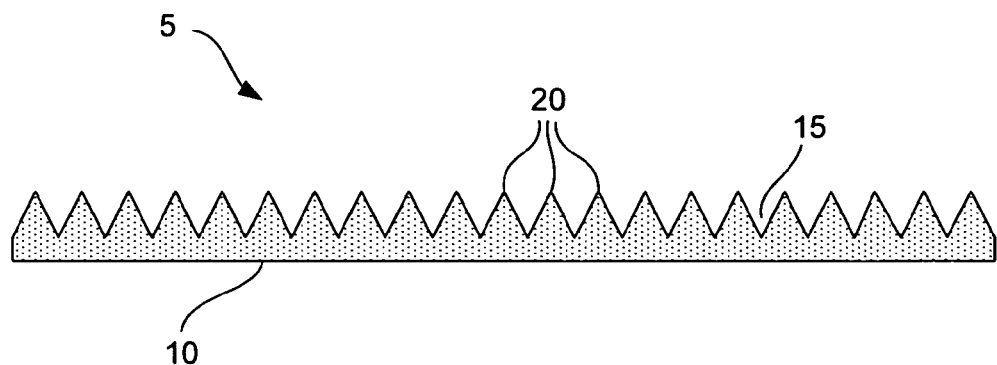
FIG. 1 shows a side view of one embodiment of an amorphous diamond material in accordance with the present invention.
Figure 3:
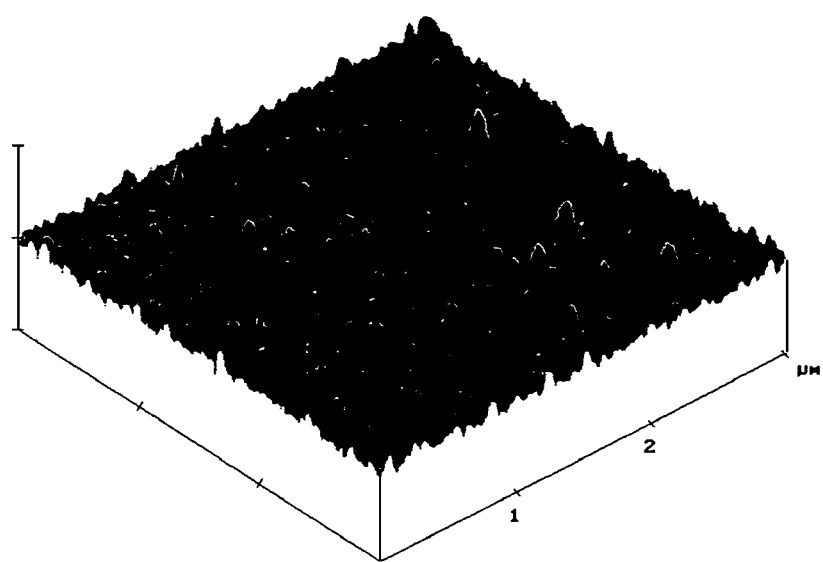
FIG. 3 shows a perspective view of one embodiment of an amorphous diamond material made using a cathodic arc procedure in accordance with one aspect of the present invention.
Figure 4:
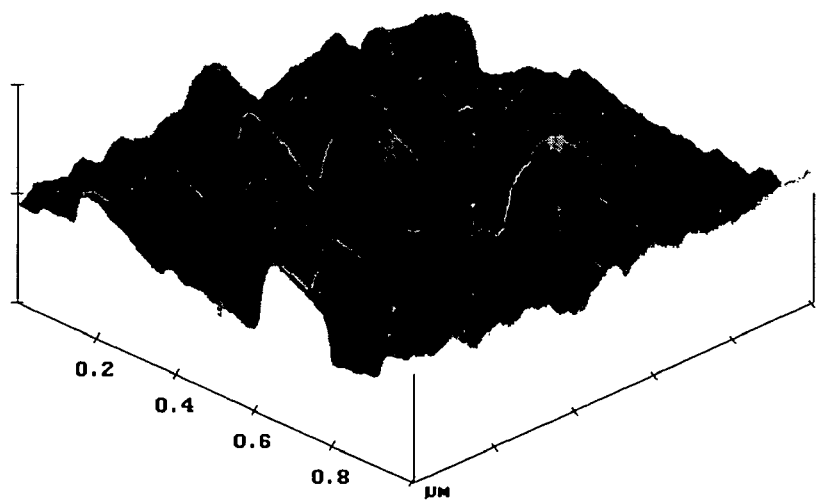
FIG. 4 shows an enlarged view of a section of the amorphous diamond material shown in FIG. 3.

Another aspect of the present amorphous diamond material that facilitates electron emission is the presence of certain geometric configurations. Referring now to FIG. 1, is shown a side view of one embodiment of a configuration for the amorphous diamond material 5, made in accordance with the present invention. Specifically, the amorphous diamond material has an energy input surface 10, that receives energy, for example, thermal energy, and an emission surface 15 that emits electrons therefrom. In one aspect, in order to further facilitate the emission of electrons, the emission surface can be configured with an emission surface that has a roughness or asperity, that focuses electron flow and increases current output, such asperity represented here by a plurality of peaks or projections 20. It should be noted that although FIG. 1 illustrates uniform peaks, such is only for convenience, and that the amorphous diamond of the present invention is typically non-uniform and the distances between peaks and the peak heights can vary as shown in FIGS. 3 and 4.

While a number of prior devices have attempted to thusly focus electrons, for example by imparting a plurality of pyramids or cones to an emission surface, none have as of yet, been able to achieve the high current output required to be viable for many applications, using a feasible energy input in a cost effective manner. More often than not, this inadequacy results from the fact that the pyramids, cones, etc. are too large and insufficiently dense to focus the electrons as needed to enhance flow. Such sizes are often greater than several microns in height, thus allowing only a projection density of less than 1 million per square centimeter. While carbon nanotubes have achieved higher outputs than other known emitters, carbon nanotubes have shown to be fragile, short lived, and inconsistent in the levels and flow of electrons achieved.

In one aspect of the present invention, the asperity of the emission surface can have a height of from about 10 to about 10,000 nanometers. In another aspect, the asperity of the emission surface can have a height of from about 10 to about 1,000 nanometers. In another aspect, the asperity height can be about 800 nanometers. In yet another aspect, the asperity height can be about 100 nanometers. Further, the asperity can have a peak density of at least about 1 million peaks per square centimeter of emission surface. In yet another aspect, the peak density can be at least about 100 million peaks per square centimeter of the emission surface. In a further aspect, the peak density can be at least about 1 billion peaks per square centimeter of the emission surface. Any number of height and density combinations can be used in order to achieve a specific emission surface asperity, as required in order to generate a desired electron output. However, in one aspect, the asperity can include a height of about 800 nanometers and a peak density of at least about, or greater than about 1 million peaks per square centimeter of emission surface. In yet another aspect, the asperity can include a height of about 1,000 nanometers and a peak density of at least about, or greater than 1 billion peaks per square centimeter of emission surface.

The amorphous diamond material of the present invention is capable of utilizing a variety of different energy input types in order to generate electrons. Examples of suitable energy types can include without limitation, heat or thermal energy, light or photonic energy, and electric and electric field energy. Thus, suitable energy sources are not limited to visible light or any particular frequency range and can include the entire visible, infrared, and ultraviolet ranges of frequencies. Those of ordinary skill in the art will recognize other energy types that may be capable of sufficiently vibrating the electrons contained in the amorphous diamond material to affect their release and movement through and out of the material. Further, various combinations of energy types can be used in order to achieve a specifically desired result, or to accommodate the functioning of a particular device into which the amorphous diamond material is incorporated.

In one aspect of the invention, the energy type utilized can be thermal energy. To this end, an energy absorber and collection layer can be used in connection with or coupled to the diamond-like carbon material of the present invention that aids in the absorption and transfer of heat into the material. As will be recognized by those of ordinary skill in the art, such an absorber can be composed of a variety of materials that are predisposed to the absorption of thermal energy, such as carbon black, etc. In accordance with the present invention, the thermal energy absorbed by the diamond-like carbon material can have a temperature of less than about 500° C. Additionally, the photonic or thermal energy can be sufficient to maintain the cathode at a temperature from about 100° C. to about 1800° C. Typically, an energy input of from about 200° C. to about 300° C. can be common. Additionally, absorber collection layers can be designed for absorbing photonic and/or thermal energy such as carbon black, sprayed graphite particles, or any other dark or black body. In one alternative, the absorber collection layer can have an increased surface roughness to enhance the amount of light and/or heat absorbed. Various methods of providing textured surfaces are known to those skilled in the art.

In another aspect of the present invention, the energy used to facilitate electron flow can be electric field energy (i.e. a positive bias). Thus, in some embodiments of the present invention a positive bias can be applied in conjunction with other energy sources such as heat and/or light. Such a positive bias can be applied to the amorphous diamond material and/or intermediate member described below, or with a variety of other mechanisms known to those of ordinary skill in the art. Specifically, the negative terminal of a battery or other current source can be connected to the electrode and/or amorphous diamond and the positive terminal connected to the intermediate material or gate member placed between the amorphous diamond electron emission surface and the anode.

Figure 2:
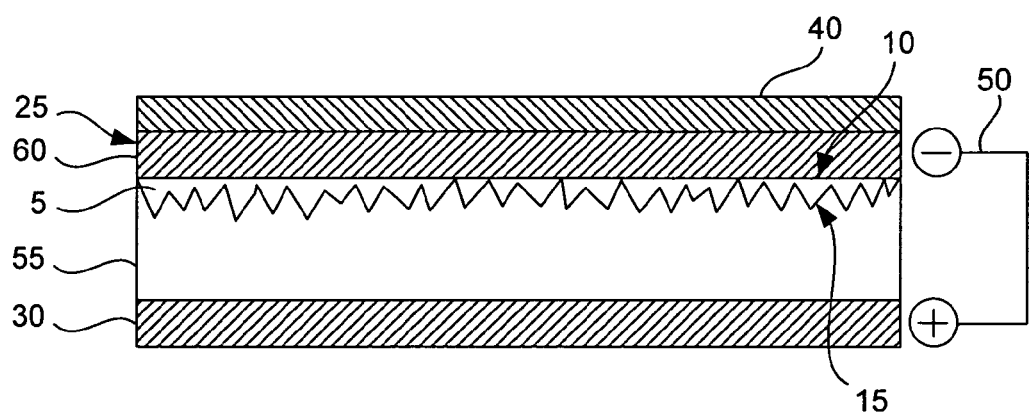
FIG. 2 shows a side view of a thermoelectric conversion device configured as a solar cell in accordance with one embodiment of the present invention.

The diamond-like carbon material of the present invention can be further coupled to, or associated with a number of different components in order to create various devices. Referring now to FIG. 2, is shown one embodiment of a diamond-like carbon thermoelectric conversion device configured as an electrical generator in accordance with the present invention. Notably, the cathode 25 has a layer of diamond-like carbon material 5 coated thereon. The surface of the diamond-like carbon material which contacts the cathode is input surface 10. Further, as discussed above, an optional energy collection layer 40 can be coupled to the cathode opposite the diamond-like carbon layer. The energy collector can be included as desired, in order to enhance the collection and transmission of thermal or photonic energy to the diamond-like carbon material. An intermediate member 55 is electrically coupled to the electron emission surface 15 of the diamond-like carbon material 5. An anode 30 can be electrically coupled to the intermediate member opposite the diamond-like carbon material.

In an alternative embodiment, the diamond-like carbon material 5 can be coated on the anode 30, rather than the cathode 25. In some configurations, performance of the device can be improved by coating the anode with the diamond-like carbon. Alternatively, each of the anode and cathode can have diamond-like carbon coated thereon. It has been discovered that use of diamond-like carbon on the anode side can provide the desired electron emission, regardless of the presence of diamond-like carbon on the cathode emission surface. The presence of a diamond-like carbon layer on the anode appears to have a more significant affect on the electron emission than a diamond-like carbon layer on the cathode side. Thus, in some embodiments, the cathode can be in direct contact with the intermediate layer, e.g., without a diamond-like carbon layer, while the anode includes a layer of diamond-like carbon formed thereon. Typically, the asperities can be directed toward the intermediate layer. In this case the diamond-like carbon layer can be deposited on the anode as discussed herein with respect to the cathode. Alternatively, the diamond-like carbon layer can be formed on the intermediate layer such that the asperities are directed toward the anode. In this embodiment, the anode can then be formed on the diamond-like carbon layer via any suitable method such as those processes described above.

In one aspect of the present invention, the entire diamond-like carbon thermoelectric conversion device is a solid assembly having each layer in continuous intimate contact with adjacent layers and/or members. Most typically, the anode and the cathode are substantially parallel such that the distance between the anode and cathode is substantially the same across the entire device.

Those of ordinary skill in the art will readily recognize other components that can, or should, be added to the assembly of FIG. 2 in order to achieve a specific purpose, or make a particular device. By way of example, without limitation, a connecting line 50 can be placed between the cathode and the anode to form a complete circuit and allow electricity to pass that can be used to run one or more electricity requiring devices (not shown), or perform other work. Further, input and output lines, as well as an electricity source (not shown) can be connected to the intermediate member 55, in order to provide the current required to induce an electric field, or positive bias, as well as other needed components to achieve a specific device, will be readily recognized by those of ordinary skill in the art.

The above-recited components can take a variety of configurations and be made from a variety of materials. Each of the layers discussed below can be formed using any number of known techniques such as, but not limited to, vapor deposition, thin film deposition, preformed solids, powdered layers, screen printing, or the like. In one aspect, each layer is formed using deposition techniques such as PVD, CVD, or any other known thin-film deposition process. In one aspect, the PVD process is sputtering or cathodic arc. Further, suitable electrically conductive materials and configurations will be readily recognized by those skilled in the art for the cathode 25 and the anode 30. Such materials and configurations can be determined in part by the function of the device into which the assembly is incorporated. Additionally, the layers can be brazed, glued, or otherwise affixed to one another using methods which do not interfere with the thermal and electrical properties as discussed below. Although, a variety of geometries and layer thicknesses can be used typical thicknesses are from about 10 nanometers to about 3 microns for the amorphous diamond emission surface and from about 1 micron to about 1 millimeter for other layers.

The cathode 25 can be formed having a base member 60 with a layer of amorphous diamond 5 coated over at least a portion thereof. The base member can be formed of any conductive electrode material such as a metal. Suitable metals include, without limitation, copper, aluminum, nickel, alloys thereof, and the like. One currently preferred material used in forming the base member is copper. In another preferred embodiment, the material used in forming the base member can be an aluminum-magnesium alloy. In yet another aspect, the conductive electrode can be formed of a conductive silver grease. Various silver greases are commercially available from a number of vendors or can be manufactured according to well known processes. Silver grease can be readily printed using conventional screen printing processes. Similarly, the anode 30 can be formed of the same materials as the base member or of different conductive materials. Currently, the preferred cathode material is copper. As a general guideline, the anode and/or cathode base member can have a work function of from about 3.5 eV to about 6.0 eV and in a second embodiment from about 3.5 eV to about 5.0 eV. Although a variety of thicknesses are functional for the cathode and/or anode, typical thickness range from about 0.1 mm to about 10 mm.

The base member 60 of the cathode 25 can be a single or multiple layers. In one embodiment, the base member is a single layer of material. In another embodiment, the base member includes a first layer and a second layer (not shown) such that the second layer is coupled between the first layer and the energy input surface of the amorphous diamond layer. The second layer acts to improve electron conduction to the emission surface of the diamond layer. Generally, when a second layer is used as part of the base member, it is preferred that the second layer comprise a material which has a work function which is less than the work function of the first layer. Typically, the second layer comprises a material having a low work function of from about 2.0 eV to about 4.0 eV, although work functions of from about 2.0 eV to about 3.0 eV are also suitable. More preferably, the second layer comprises a material having a work function of from about 1.5 eV to about 3.5 eV. Suitable materials for use in the second layer include, without limitation, Cs, Sm, Al—Mg, Li, Na, K, Rb, Be, Mg, Ca, Sr, Ba, B, Ce, Al, La, Eu, and mixtures or alloys thereof. In one specific aspect, the second layer can comprise Cs, Sm, Al—Mg and alloys thereof. In a more specific aspect, the second layer can comprise Be, Mg, Cs, or Sm, and most preferably Cs.

In order to improve heat transfer toward the diamond-like carbon layer, the second layer can comprise a material which has a thermal conductivity of greater than about 100 W/mK. As with other layers or members, a variety of thicknesses can be used however, the second layer is often from about 1 micron to about 1 millimeter. Those skilled in the art will recognize that typical low work function materials also readily oxidize. Thus, it may be desirable to form at least the second layer, and often the entire thermoelectric conversion device, under a vacuum or other inert environment.

Without wishing to be bound to any particular theory, the ability of the present invention to produce electricity can be viewed as a stepping process related to the band gap between materials, work function, and thermal conductivity of each layer. Specifically, the second layer of the cathode can be made of a material that acts to step the electrons closer to vacuum energy or conduction band, (i.e. decrease the band gap between the first layer and vacuum energy). Additionally, the second layer can have a high thermal conductivity in order to improve electron flow toward the electron emission surface. The electrons in the second layer can then be transmitted to the diamond-like carbon layer where the distorted tetrahedral coordinations of the amorphous diamond create a variety of different work function and band gap values (i.e. within the unoccupied conduction band) within the amorphous diamond layer, such that some of the electron states approach and exceed the vacuum energy.

The material for use in the intermediate member can then be chosen to minimize heat loss by allowing the electrons to transfer, or "step" back down to the anode material. This decreases the amount of energy which is lost in the system. For example, a large step from amorphous diamond down to a high work function material can be used in the present invention; however, some of the electrical energy is lost as heat. Thus, more than one intermediate member and/or base member layers can be incorporated into the device to provide varying degrees of "steps up" and "steps down" between the energy band gaps among the respective layers. Thus, the intermediate member can be formed of a plurality of layers each having different electrical and thermal properties.

In addition, it is frequently desirable to minimize the thermal conductivity of the intermediate member such that there is a thermal gradient maintained from the cathode to the anode. Further, operating temperatures can vary greatly depending on the application and energy source. Cathode temperatures can be from about 100° C. to about 1800° C. and can often be above about 300° C. Alternatively, cathode temperatures can be below about 100° C. such as from about 0° C. to about 100° C. Although temperatures outside these ranges can be used, these ranges provide an illustration of the temperature gradient which can exist across the devices of the present invention.

As shown in FIG. 2, an intermediate member 55 can be coupled to the electron emission surface 15. In accordance with the present invention, the intermediate member can be a dielectric material. The dielectric material can be any dielectric material known to one of ordinary skill in the art, including polymers, glasses, ceramics, inorganic compounds, organic compounds, or mixtures thereof. Examples include, without limitation, $BaTiO_3$, PZT, $Ta_2O_3$, PET, $PbZrO_3$, $PbTiO_3$, NaCl, LiF, MgO, $TiO_2$, $Al_2O_3$, BaO, KCl, $Mg_2SO_4$, fused silica glass, soda lime silica glass, high lead glass, and mixtures or composites thereof. In one aspect, the dielectric material is $BaTiO_3$. In another aspect, the dielectric material is PZT. In another aspect, the dielectric material is $PbZrO_3$. In yet another aspect, the dielectric material is $PbTiO_3$. Additionally, the dielectric material can be a graphitic material. A number of graphitic materials can have a sufficiently high electrical resistivity to support a voltage of 0.1 V. Further, materials having a relatively low electrical and thermal conductivity such as hexagonal boron nitride (about 40 W/mK), alumina, zirconia, other ceramics, or dielectrics listed above can be mixed with relatively higher thermal conductivity graphite (above about 200 W/mK). For example, in one currently preferred embodiment the intermediate member can comprise a mixture of graphite and hexagonal boron nitride. These materials can be provided as a layered combination or as a compressed powder mixture.

Additional materials which can be suitable for use in the intermediate member can include, but are not limited to, metal matrix composite, reverse metal matrix composite, BiSb, $Bi_2T_{23}$, PbTe, SiGe, $Bi_2Te_3$, $Zn_4Sb_3$, $La_2Te_3$, and mixtures, composites or combinations thereof. Metal matrix composite (MMC) materials can be useful in that such materials have sufficient electrical conductivity for use in maintaining a voltage across the intermediate member. Further, the thermal conductivity and resistivity can be adjusted by changing the concentration of secondary material within the composite and/or varying the secondary material composition. Typically useful MMC materials include a metal matrix material having a secondary material dispersed therein. Most often the concentration of secondary material is from about 5% to about 25%, although concentrations outside this range can be used. For example, alumina impregnated aluminum can be highly useful as an MMC. Similarly, fibers, whiskers or particles of materials such as, but not limited to, alumina, silicon carbide, steel, graphite, carbon, and the like can be dispersed in a metal matrix.

Alternatively, reverse MMC materials can be useful. Such reverse MMC materials have a non-metal matrix with a metal dispersed therein. One particularly suitable example of a reverse MMC is metal impregnated PYREX glass.

Almost any material useful in construction of a capacitor can be useful. However, in one aspect, the dielectric material can also be a piezoelectric material. The presence of the diamond-like layer on the cathode makes using almost any other type of material for the intermediate member impractical.

The dielectric material can be configured in any way that maintains separation between the diamond-like carbon layer and the anode. Alternatively, diamond-like carbon layers can be electrically coupled to both electrodes. In another alternative aspect, the intermediate member can be a single layer or a number of layers. In this case the dielectric material can be tailored to improve conversion efficiency and the more closely match the bandgap of adjacent materials. Advantageously, this configuration of dielectric layers may decrease the incidence of preferred pathways of electron flow, due to a more uniform distribution of charge across the intermediate member. Further, in such multi-layered configurations, the intermediate member can include one or more additional layers of diamond-like carbon.

The thickness of the dielectric layer can be any thickness that allows the conversion of thermal energy to electrical energy or visa versa in various aspect of the present invention. Specifically, the thickness and composition of the intermediate member can be adjusted to control resistivity. In addition, adjusting the thickness of the intermediate member is a balance between voltage and current, e.g., efficiency. For example, a thinner intermediate layer will increase current, while also decreasing voltage. Diamond materials typically have a bandgap of about 5 eV, and in some cases greater than 5 eV, depending on the ratio of $sp^2/sp^3$ bonding in the amorphous diamond material. Prior art solar cells tend to have about 0.5 V output (silicon based devices have a bandgap of only 1.1 eV which can result in about 0.6 V), while diamond solar cells of the present invention can have up to 5.5 V output. Further, amorphous diamond presents a wide range of bandgaps such that dopants are not required. Thus, excited electrons can generally be maintained at higher energy states without immediately falling back to the ground state. The energy states in amorphous diamond are, however, discrete, unlike metallic materials which are overlapping. Consequently, electrons can "step" up the discrete energy positions much like stepping up a ladder. Thus, the thickness of the intermediate layer can be used to design the thermoelectric conversion device for a specific application. In some applications it can be desirable to have a lower voltage and a higher current, while other applications can require higher voltage with less current. Typically, the intermediate member can be a solid material which is of a sufficient thickness and material type capable of supporting a voltage of greater than about 0.1 V, such as from about 0.1 V to about 6 V, and preferably from about 1 V to about 5.5 V. As mentioned above, the material and the thickness of the intermediate member can affect the resistivity and thus the voltage which can be supported across the intermediate member.

Although the thickness of a particular material is best determined based on experimentation and the guidelines set forth herein, the intermediate member can have a thickness sufficient to achieve a resistivity from about 0.1 μΩ-cm to about 100 μΩ-cm, and preferably from about 20 μΩ-cm to about 80 μΩ-cm. This can often correspond to a thickness which will vary with the material, but can usually range from about 0.05 μm to about 500 μm thick. In another aspect, the dielectric material can be from about 0.2 μm to about 100 μm thick. In yet another aspect, the layer of dielectric material is from about 0.5 μm to about 10 μm thick. For example, an intermediate member formed of PZT at a thickness of about 1 μm can provide good results.

Additionally, amorphous diamond has a high radiation hardness such that it is resistant to aging and degradation over time. In contrast, typical semiconductor materials are UV degradable and tend to become less reliable over time. As mentioned elsewhere, electrons in amorphous diamond are excited via the thermoelectric effect rather than the photoelectric effect. As such, amorphous diamond materials exhibit a change in electron emission properties with changes in temperature. For example, amorphous diamond can be used to convert a substantial portion of heat into electricity, regardless of the temperature. Thus, as the temperature increases, a substantial increase in electron emission is also realized. Conversion efficiencies of over 30% and in many cases over 50% can be achieved in solar cells constructed in accordance with the principles of the present invention. Conversion efficiencies tend to increase as resistivity and voltage increase. Thus, it can be desirable to balance conversion efficiencies with current across the intermediate member, depending on the intended application.

In one aspect, the intermediate member can be formed of a material having a thermal conductivity of less than about 200 W/mK, and in many cases less than about 100 W/mK. Further, the intermediate member can have a resistivity of less than about 80 μΩ-cm at 20° C. In choosing appropriate materials for use in the intermediate layer, at least two factors are considered. First, the material should act to minimize thermal transfer across the layer. Thus, materials having a relatively low thermal conductivity are desirable. In one aspect, the intermediate member comprises a material having a thermal conductivity less than about 200 W/mK such as below about 80 W/mK. Materials having thermal conductivities of below about 40 W/mK can also be advantageously used. Second, the intermediate member should be relatively conductive. In one aspect, the intermediate member also has a resistivity of less than about 80 μΩ-cm at 20° C. and more preferably below about 10 μΩ-cm at 20° C. Specifically, reference is now made to FIG. 8 which is a plot of resistivity versus thermal conductivity for various elements. It is understood that various alloys and compounds will also exhibit the properties desirable for the intermediate member and such are considered within the scope of the present invention.

Figure 8:
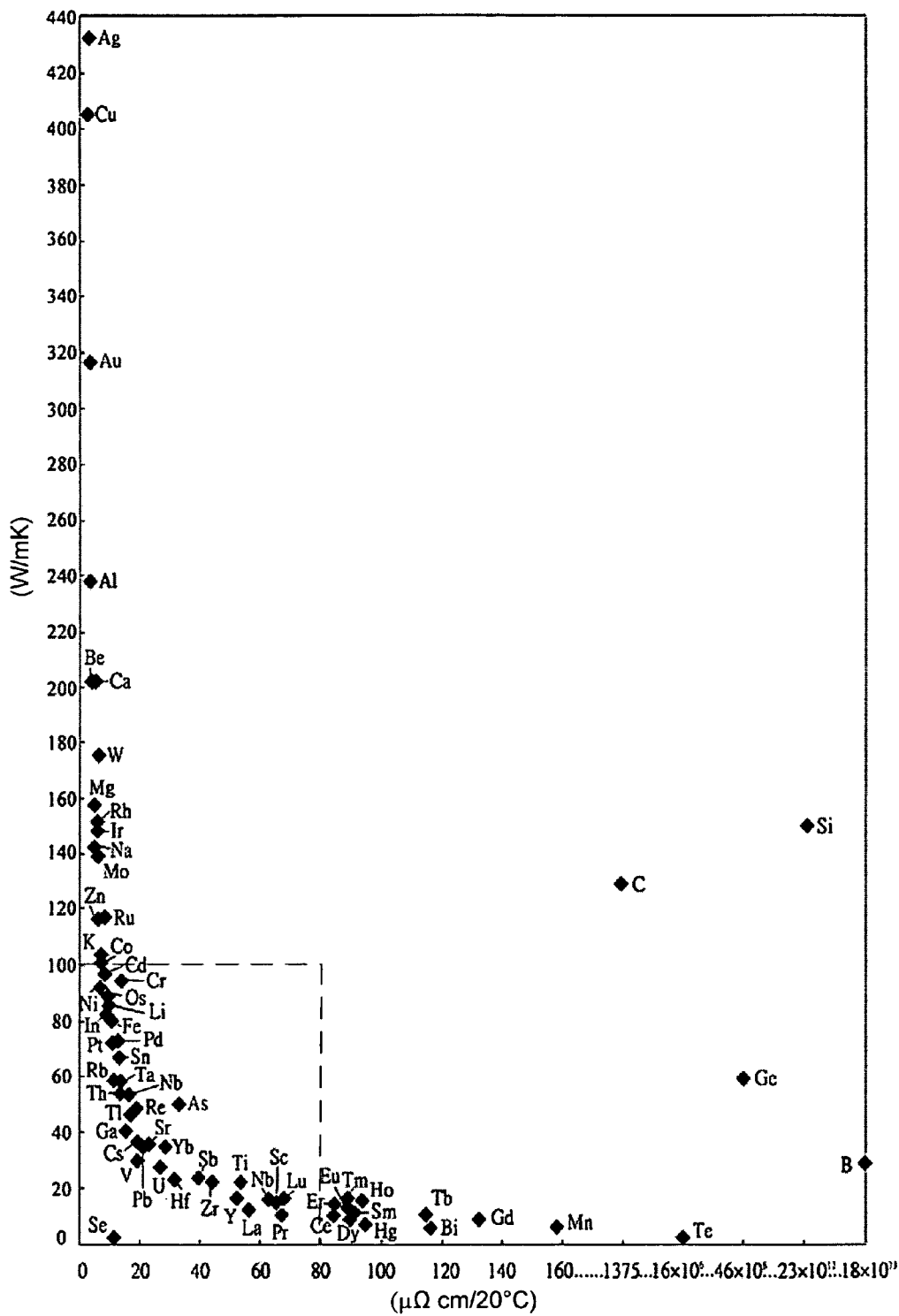
FIG. 8 shows a graph of resistivity versus thermal conductivity for most the elements.

Referring to FIG. 8 it can be seen that among the elements there is a general trend of increasing resistivity (decreased conductivity) with decreases in thermal conductivity. However, elements in the region shown by a dashed box exhibit both low thermal conductivity and high electrical conductivity. Exemplary materials from this region include Pb, V, Cs, Hf, Ti, Nb, Zr, Ga, and mixtures or alloys thereof. In one aspect of the present invention, the intermediate member comprises Cs. One helpful measure of suitable electronic properties for various layers is work function. The intermediate member can comprise a material having a work function of from about 1.5 eV to about 4.0 eV, and in another aspect can be from about 2.0 eV to about 4.0 eV. Other suitable materials can also be chosen based on the above guidelines. In one embodiment of the present invention, the intermediate member can have a thickness of from about 0.1 millimeters to about 1 millimeter.

In an alternative embodiment, the intermediate member can be constructed so as to satisfy the above guidelines regarding thermal and electrical conductivity while expanding the types of materials which can be used. Specifically, the intermediate member can be formed of a primary thermally insulating material having a plurality of apertures extending therethrough (not shown). Although electrically conductive materials are of course preferred any thermally insulating material can be used. Suitable insulating materials can be chosen by those skilled in the art. Non-limiting examples of suitable thermally insulating materials include ceramics and oxides. Several currently preferred oxides include $ZrO_2$, $SiO_2$, and $Al_2O_3$. The apertures extend from the electron emission surface of the diamond layer to the anode. One convenient method of forming the apertures is by laser drilling. Other methods include anodization of a metal such as aluminum. In such a process small indentations can be formed in the aluminum surface, and then upon anodization, electrons will flow preferentially through the indented areas and dissolve the aluminum to form straight and parallel apertures. The surrounding aluminum is oxidized to form $Al_2O_3$.

Once the apertures are formed, a more highly conductive metal can be deposited into the apertures. The apertures can be filled by electrodeposition, physical flow, or other methods. Almost any conductive material can be used, however in one aspect the conductive material can be copper, aluminum, nickel, iron, and mixtures or alloys thereof. In this way, conductive metals can be chosen which have high conductivity without the limitations on thermal conductivity. The ratio of surface of area covered by apertures to surface area of insulating material can be adjusted to achieve an overall thermal conductivity and electrical conductivity within the guidelines set forth above. Further, the pattern, aperture size, and aperture depth can be adjusted to achieve optimal results. In one aspect, the surface area of the apertures constitute from about 10% to about 40% of the surface of the intermediate layer which is in contact with the electron emission surface of the amorphous diamond layer.

Because of the ease with which electrons can be generated using the diamond-like carbon material of the present invention, it has been found that inducing electron flow using an applied electric field facilitates the absorption of heat at the electron input surface, thus enabling the electron emitter of the present invention to be used as a cooling device. As such, the present invention encompasses a cooling device that is capable of absorbing heat by emitting electrons under an induced electrical field. Such a device can take a variety of forms and utilize a number of supporting components, such as the components recited in the electrical generator above. In one aspect, the cooling device is capable of cooling an adjacent area to a temperature below 100° C. Alternatively, the present invention can be used as a heat pump to transfer heat from a low heat area or volume to an area having higher amounts heat.

In these embodiments of the present invention, application of electrical current results in a forced heat flow from the cathode to the anode. In this way, the thermoelectric conversion device can also function as a cooling device. Such a cooling device can be used in connection with dissipating heat from high powered electronics such as ULSI, laser diodes, CPUs, or the like, or as a cooling device for use in refrigeration systems.

The amorphous diamond material used in the present invention can be produced using a variety of processes known to those skilled in the art. However, in one aspect, the material can be made using a cathodic arc method. Various cathodic arc processes are well known to those of ordinary skill in the art, such as those disclosed in U.S. Pat. Nos. 4,448,799; 4,511,593; 4,556,471; 4,620,913; 4,622,452; 5,294,322; 5,458,754; and 6,139,964, each of which is incorporated herein by reference. Generally speaking, cathodic arc techniques involve the physical vapor deposition (PVD) of carbon atoms onto a target, or substrate. The arc is generated by passing a large current through a graphite electrode that serves as a cathode, and vaporizing carbon atoms with the current. The vaporized atoms also become ionized to carry a positive charge. A negative bias of varying intensity is then used to drive the carbon atoms toward an electrically conductive target. If the carbon atoms contain a sufficient amount of energy (i.e. about 100 eV) they will impinge on the target and adhere to its surface to form a carbonaceous material, such as amorphous diamond. Amorphous diamond can be coated on almost any metallic substrate, typically with no, or substantially reduced, contact resistance.

In general, the kinetic energy of the impinging carbon atoms can be adjusted by the varying the negative bias at the substrate and the deposition rate can be controlled by the arc current. Control of these parameters as well as others can also adjust the degree of distortion of the carbon atom tetrahedral coordination and the geometry, or configuration of the amorphous diamond material (i.e. for example, a high negative bias can accelerate carbon atoms and increase $sp^3$ bonding). By measuring the Raman spectra of the material the $sp^3/sp^2$ ratio can be determined. However, it should be kept in mind that the distorted tetrahedral portions of the amorphous diamond layer are neither $sp^3$ nor $sp^2$ but a range of bonds which are of intermediate character. Further, increasing the arc current can increase the rate of target bombardment with high flux carbon ions. As a result, temperature can rise so that the deposited carbon will convert to more stable graphite. Thus, final configuration and composition (i.e. band gaps, NEA, and emission surface asperity) of the amorphous diamond material can be controlled by manipulating the cathodic arc conditions under which the material is formed. Additionally, other processes can be used to form DLC such as various vapor deposition processes, e.g. PVD, CVD, or the like. Further, laser ablation processes can be useful in obtaining diamond-like carbon films over large surface areas. Laser ablation processes are relatively recent development by Oak Ridge National Labs and other research groups and companies which involves laser ablation of a carbon source to form diamond. Regardless of the specific processes employed, the diamond-like carbon material and other layers of the device can be formed without the necessity of a vacuum space between the electron emitting layer and the anode which greatly reduces production costs and increase reliability of the devices formed thereby.

Various applications of the devices and methods discussed herein will occur to those skilled in the art. In one aspect, the thermoelectric conversion devices of the present invention can be incorporated into devices which produce waste heat. The cathode side or energy input surface of the present invention can be coupled to a heat source such as a boiler, battery such as rechargeable batteries, CPUs, resistors, other electrical components, or any other device which produces waste heat as a byproduct of its operation which is not otherwise utilized. For example, an electrical generator of the present invention can be coupled to a laptop battery. As such the electrical generator can supplement the power supply and thus extend battery life. In another example, one or more electrical generators can be attached to the outer surface of a boiler or other heat producing unit of a manufacturing plant to likewise supplement the electrical demands of the manufacturing process. Thus, as can be seen, a wide variety of applications can be devised using thermal, light or other energy sources to produce electricity in useful amounts.

Moreover, diamond-like carbon may be coated onto ordinary electrodes to facilitate the flow of electrons. Such electrodes can be used in batteries and electro-deposition of metals, such as electroplating. In one aspect, the electrodes can be used in an aqueous solution. For example, electrodes that are used to monitor the quality of water or other food stuff, such as juice, beer, soda, etc. by measuring the resistivity of the water. Due to its anti-corrosive properties, electrodes of amorphous diamond pose a significant advantage over conventional electrodes.

One particular application where amorphous diamond electrodes would be of significant advantage is in electro-deposition applications. Specifically, one problem experienced by most electro-deposition devices is the polarization of the electrode by the absorption of various gasses. However, due to the strongly inert nature of amorphous diamond, cathodes and anodes coated therewith are virtually unpolarizable. Further, this inert nature creates an electric potential in aqueous solution that is much higher than that obtained using metallic or carbon electrodes. Under normal circumstances, such a voltage would dissociate the water. However, due to the high potential of amorphous diamond, the solute contained in the solution is driven out before the water can be dissociated. This aspect is very useful, as it enables the electro-deposition of elements with high oxidation potentials, such as Li and Na which has been extremely difficult, if not impossible in the past.

In a similar aspect, because of the high potential achieved by amorphous diamond electrodes in solution, solutes that are present in very minute amounts may be driven out of solution and detected. Therefore, the material of the present invention is also useful as part of a highly sensitive diagnostic tool or device which is capable of measuring the presence of various elements in solution, for example, lead, in amounts as low as parts per billion (ppb). Such applications include the detection of nearly any element that can be driven or attracted to an electrical charge, including biomaterials, such as blood and other bodily fluids, such as urine.

In one alternative embodiment of the present invention, at least one of the cathode and the anode can be configured to transmit light. One example of an electrode configured to transmit light can be constructed of a transparent material coated with indium tin oxide. The transparent or translucent material can be any transparent material known, such as a glass, or a polymer such as a plastic or an acrylic. In such embodiments, the transparency can be desirable for aesthetic or practical reasons. A more detailed description of specific light emitting devices and configurations that utilize DLC or amorphous diamond and configurations therefor is contained in Applicant's copending U.S. patent application Ser. No. 11/045,016, filed on Jan. 26, 2005, which is incorporated herein by reference.

The cathode and the anode can be of any shape or configuration that may be of use in the various potential embodiments of the present invention. In one aspect, the cathode and the anode can be planar. In another aspect, the cathode and/or anode can be rigid. However, in many commercial embodiments, it can be desirable to provide flexible materials. Thus, providing a flexible cathode and/or anode can allow for construction of flexible solar cells.

Other aspects of the present invention contemplate improving the reliability of the thermoelectric conversion device. In one aspect, the reliability can be improved by avoiding organic adhesives to bond the electrodes together. Many organic materials are not stable, particularly at higher temperatures. One way to avoid using organic adhesives is to deposit a layer of dielectric material and any cathode and/or anode materials directly on an electrode. One skilled in the art would recognize various methods of accomplishing this, including, without limitation, the use of a low temperature plasma spray. In another aspect, organic adhesives can be avoided by bonding together various layers with low temperature sintering. As such, sintering should be accomplished below about 500° C. in order to avoid degradation of the amorphous diamond layer. In yet another aspect, a thermally stable adhesive can be used such as, without limitation, a silicone adhesive.

As alluded to above, the present invention encompasses methods for making the diamond-like thermoelectric conversion devices disclosed herein, as well as methods for the use thereof. In addition to the electrical generator and cooling devices recited above, a number of devices that operate on the principles of emitting electrons may beneficially utilize the amorphous diamond material of the present invention. A number of such devices will be recognized by those skilled in the art, including without limitation, transistors, ultra fast switches, ring laser gyroscopes, current amplifiers, microwave emitters, luminescent sources, and various other electron beam devices.

In one aspect, a method for making an amorphous diamond material capable of emitting electrons by absorbing a sufficient amount of energy, includes the steps of providing a carbon source, and forming an amorphous diamond material therefrom, using a cathodic arc method. A method for generating a flow of electrons or generating an electrical current can include the steps of forming an amorphous diamond material as recited herein, and inputting an amount of energy into the material that is sufficient to generate electron flow. The second layer of the base member of the cathode and the intermediate member can be formed using CVD, PVD, sputtering, or other known process. In one aspect, the layers are formed using sputtering. In addition, the anode can be coupled to the intermediate member using CVD, PVD, sputtering, brazing, gluing (e.g. with a silver paste) or other methods known to those skilled in the art. Although the anode is commonly formed by sputtering or arc deposition, the anode can be coupled to the intermediate member by brazing.

In an optional step, the diamond-like carbon thermoelectric conversion devices can be heat treated in a vacuum furnace. Heat treatment can improve the thermal and electrical properties across the boundaries between different materials. The diamond-like carbon thermoelectric conversion device can be subjected to a heat treatment to consolidate interfacial boundaries and reduce material defects. Typical heat treatment temperatures can range from about 200° C. to about 800° C. and more preferably from about 350° C. to about 500° C. depending on the specific materials chosen.

The following are examples illustrate various methods of making electron emitters in accordance with the present invention. However, it is to be understood that the following are only exemplary or illustrative of the application of the principles of the present invention. Numerous modifications and alternative compositions, methods, and systems can be devised by those skilled in the art without departing from the spirit and scope of the present invention. The appended claims are intended to cover such modifications and arrangements. Thus, while the present invention has been described above with particularity, the following Examples provide further detail in connection with several specific embodiments of the invention.

EXAMPLE 1

A copper foil is glued to a polyimide support layer. A one micron layer of amorphous diamond is deposited on the exposed copper foil electrode using a cathodic arc process. The amorphous diamond has a 50 nm asperity. An intermediate layer of PZT is deposited by screen printing to a thickness of 30 μm on the amorphous diamond. A layer of silver grease is coated on the PZT intermediate member by screen printing to form an anode. The assembly is then cured in an oven to drive off the binder used in screen printing and to consolidate the device. Attachment of wires to the copper electrodes can allow this thermoelectric conversion device to act as either an electrical generator by absorption of heat or as a cooling device by application of an electrical current.

EXAMPLE 2

The same procedure is followed as in Example 1, except the PZT layer is replaced by a mixture of graphite powder and hexagonal boron nitride powder.

EXAMPLE 3

The same procedure is followed as in Example 1, except the PZT layer is replaced by a mixture of graphite powder and aluminum oxide powder.

EXAMPLE 4

The same procedure is followed as in Example 1, except the PZT layer is replaced by a mixture of graphite powder and zirconium oxide powder.

EXAMPLE 5

The same procedure is followed as in Example 1, except the PZT layer is replaced by a silver impregnated epoxy such that the resistivity is sufficient to support and withstand a voltage of 0.1 V across the two electrodes.

EXAMPLE 6

A glass plate is coated with carbon black and then silver grease is coated over the carbon black as a cathode layer. Amorphous diamond is then formed on the silver grease by cathodic arc. An intermediate layer of $BaTiO_3$ is then deposited on the amorphous diamond. A second coating of silver grease is formed on the intermediate layer followed by a thin layer of epoxy. These successive layers are coated in such a way that substantially no air or moisture is trapped in or between each layer. Air reduces flow of electrons and moisture will deteriorate the coating layers and reduce reliability.

The transparent glass outer layer can trap heat from the sun, similar to the green house effect. Carbon black will absorb the sung light to increase the temperature (e.g. to 200° C). The thermionic amorphous diamond will convert the heat to electricity through emission of electrons into the intermediate layer. The $BaTiO_3$ intermediate layer is used to control the resistivity and hence voltage generated. Silver grease is used as flexible electrodes, although other flexible conductive materials can be used. The epoxy can serve as a convenient packaging material for mechanical protection as well as insulation.

The above design is simple and easy to manufacture by automation. The thickness and uniformity of each layer is important. If the rigid glass is replaced by flexible PET or other transparent or translucent material, the solar panel becomes bendable so it can be mounted on a variety of substrates such as the curved roof of an automobile.

EXAMPLE 7

Figure 10:
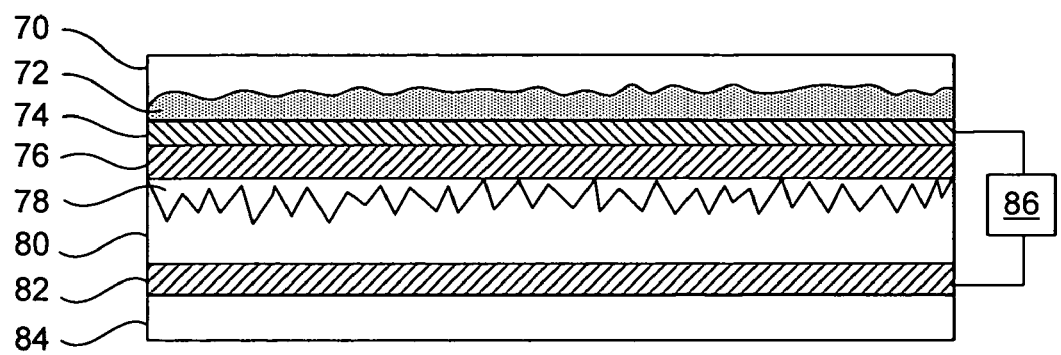
FIG. 10 shows a side view of a thermoelectric conversion device configured as a solar cell in accordance with Example 3.

Referring to FIG. 10, a glass plate 70 is coated with carbon black 72 and then an aluminum-magnesium alloy is sputtered over the carbon black as a cathode layer 74. A thin cesium coating 76 is sputtered over the base cathode layer. An amorphous diamond layer 78 is then formed on the cesium layer by cathodic arc. An intermediate layer 80 of PZT is then deposited on the amorphous diamond layer. A copper anode 82 is then formed on the intermediate layer followed by attachment of a glass insulating layer 84. A battery or other electrical device 86 can be operatively connected to each of the electrodes to store the electricity or perform useful work.

EXAMPLE 8

An amorphous diamond material was made as shown in FIG. 3, using cathodic arc deposition. Notably, the asperity of the emission surface has a height of about 200 nanometers, and a peak density of about 1 billion peaks per square centimeter. In the fabrication of such material, first, a silicon substrate of N-type wafer with (200) orientation was etched by Ar ions for about 20 minutes. Next, the etched silicon wafer was coated with amorphous diamond using a Tetrabond® coating system made by Multi-Arc, Rockaway, N.J. The graphite electrode of the coating system was vaporized to form an electrical arc with a current of 80 amps, and the arc was drive by a negative bias of 20 volts toward the silicon substrate, and deposited thereon. The resulting amorphous diamond material was removed from the coating system and observed under an atomic force microscope, as shown in FIGS. 3 and 4.

Figure 5:
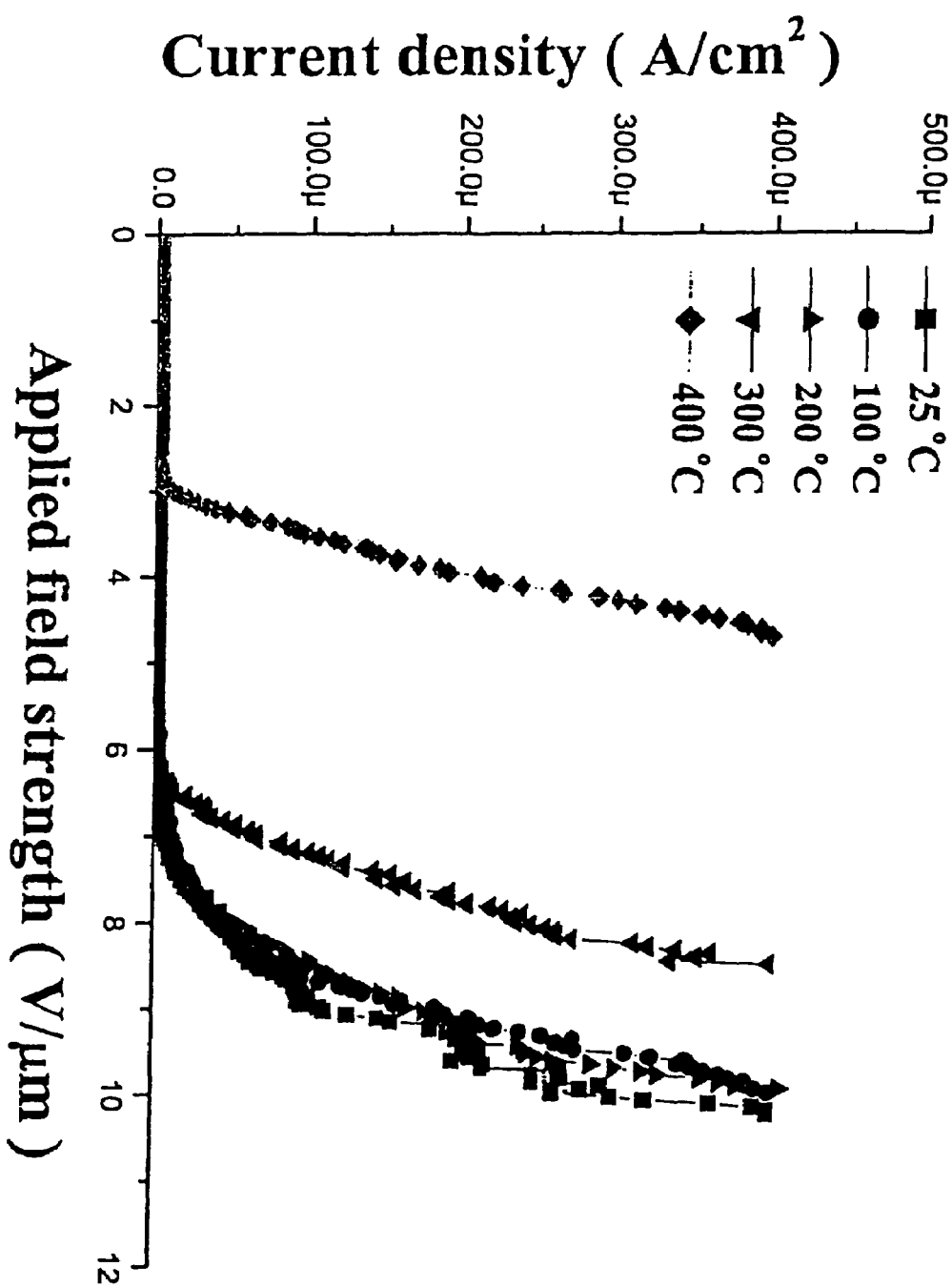
FIG. 5 shows a graphical representation of an electrical current generated under an applied electrical field at various temperatures by one embodiment of the amorphous diamond generator of the present invention.

The amorphous diamond material was then coupled to an electrode to form a cathode, and an electrical generator in accordance with the present invention was formed. An external electrical bias was applied and the resultant electrical current generated by the amorphous diamond material was measured and recorded as shown in FIG. 5 at several temperatures.

EXAMPLE 9

A 10 micron layer of copper can be deposited on a substrate using sputtering. Onto the copper was deposited 2 microns of samarium by sputtering onto the copper surface under vacuum. Of course, care should be taken so as to not expose the beryllium to oxidizing atmosphere (e.g. the entire process can be performed under a vacuum). A layer of amorphous diamond material can then be deposited using the cathodic arc technique as in Example 4 resulting in a thickness of about 0.5 microns. Onto the growth surface of the amorphous diamond a layer of magnesium can be deposited by sputtering, resulting in a thickness of about 10 microns. Finally a 10 microns thick layer of copper was deposited by sputtering to form the anode.

EXAMPLE 10

Figure 9A:
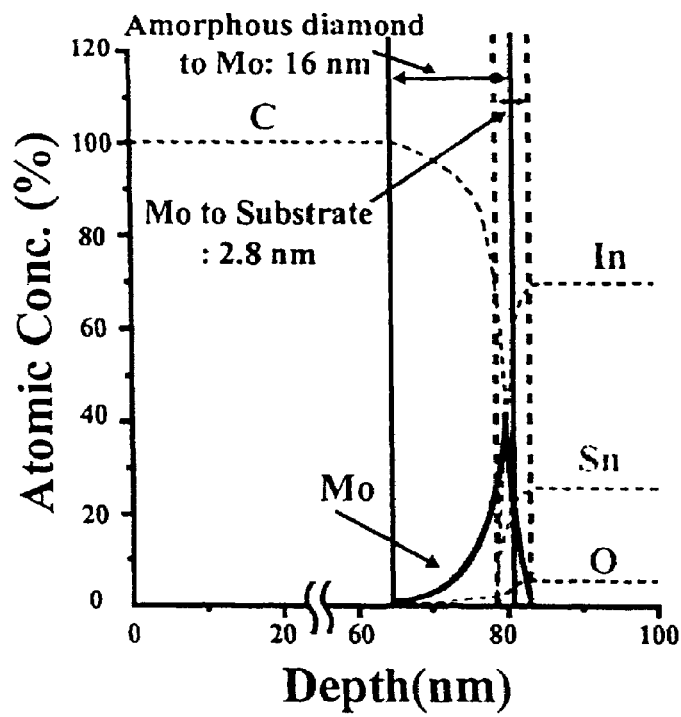
FIG. 9A shows a graph of atomic concentration versus depth for an embodiment of the present invention prior to heat treatment.
Figure 9B:
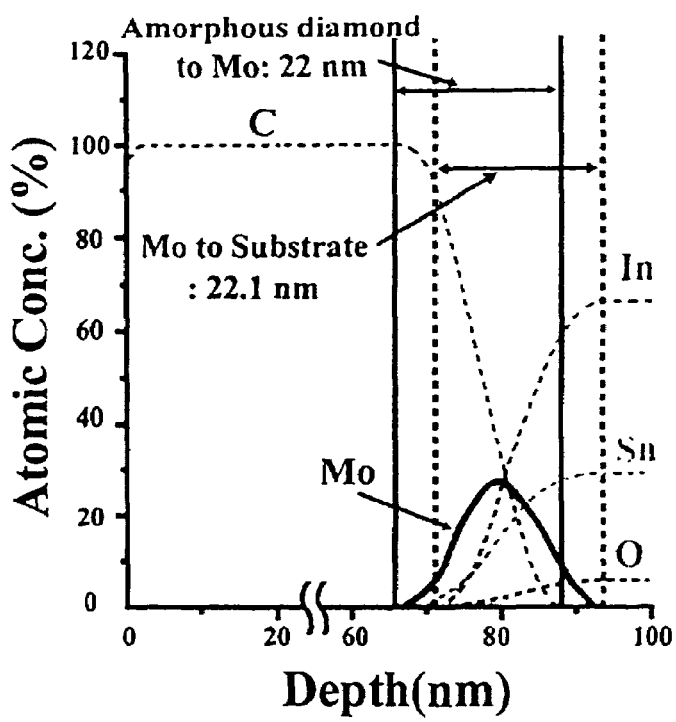
FIG. 9B shows a graph of atomic concentration versus depth for the embodiment shown in FIG. 9B subsequent to heat treatment.

A 10 micron layer of copper can be deposited on a substrate using sputtering. Onto the copper was deposited 2 microns of cesium by sputtering onto the copper surface under vacuum. Of course, care should be taken so as to not expose the cesium to oxidizing atmosphere (e.g. the entire process can be performed under a vacuum). A layer of amorphous diamond material can then be deposited using the cathodic arc technique as in Example 4 resulting in a thickness of about 65 nm. Onto the growth surface of the amorphous diamond a layer of molybdenum can be deposited by sputtering, resulting in a thickness of about 16 nm. Additionally, a 20 nm thick layer of In—Sn oxide was deposited by sputtering to form the anode. Finally, a 10 micron layer of copper was deposited on the In—Sn layer by sputtering. The cross-sectional composition of the assembled layers is shown in part by FIG. 9A as deposited. The assembled layers were then heated to 400° C. in a vacuum furnace. The cross-sectional composition of the final amorphous diamond electrical generator is shown in part by FIG. 9B. Notice that the interface between layers does not always exhibit a distinct boundary, but is rather characterized by compositional gradients from one layer to the next. This heat treatment improves the electron transfer across the boundary between the anode and the intermediate material and between the amorphous diamond and the intermediate material. Measurement of applied field strength versus current density at 25° C. resulted in a response which is nearly the same as the response shown in FIG. 5 at 400° C. It is expected that measurements at temperatures above 25° C. will show a similar trend as a function of temperature as that illustrated in FIG. 5, wherein the current density increases at lower applied voltages.

EXAMPLE 11

A first set of indium tin oxide (ITO) coated glass electrodes are constructed by coating a first ITO electrode with an amorphous diamond layer by cathodic arc, and a second ITO electrode with copper-doped zinc sulfide by screen printing. The ITO electrodes are then glued together with the coated surfaces facing each other using an epoxy. The total epoxy-filled gap between the coated surfaces of the ITO electrodes is approximately 60 microns.

A second set of ITO coated glass electrodes are constructed similarly to the first set, with the exception that the first ITO electrode lacks an amorphous diamond layer. These ITO electrodes are then glued together with the copper-doped zinc sulfide coating facing the first electrode using an epoxy. The total epoxy-filled gap between the first ITO electrode and the coated surface of the second ITO electrode is approximately 60 microns.

EXAMPLE 12

A direct current is applied to the first and second sets of electrodes of Example 7. When direct current is applied to the first set of electrodes, 40 Volts is required to generate luminescence from the copper-doped zinc sulfide layer. When direct current is applied to the second set of electrodes, 80 Volts is required to generate luminescence from the copper-doped zinc sulfide layer.

EXAMPLE 13

A set of electrodes is constructed as per the first electrodes of Example 7, having a diamond-like carbon layer. An alternating current is applied to the set of electrodes. At 60 Hz, 40 Volts is required to generate a given level of luminescence from the copper-doped zinc sulfide material. At 100 Hz, 3 Volts is required to generate a level of luminescence that is greater than the level of luminescence generated at 60 Hz. At 1000 Hz, 3 Volts is able to generate a level of luminescence that is greater than the level of luminescence generated at 100 Hz. At 3500 Hz, 3 Volts is able to generate a level of luminescence that is greater than the level of luminescence generated at 1000 Hz.

EXAMPLE 14

A set of ITO electrodes are constructed by coating both ITO electrodes with amorphous diamond layers by cathodic arc. Because amorphous diamond is deposited on both ITO electrodes, heat utilized in further construction should be less than 500° C. in order to avoid degradation of the amorphous carbon layers. Copper-doped zinc sulfide powder is mixed with a binder and spin coated on a substrate to form a thin layer. The layer of copper-doped zinc sulfide is then sandwiched between two layers of dielectric material, dried, roasted, and heat treated to diffuse the dopant into the zinc sulfide.

EXAMPLE 15

A spacer is coupled between a cathode and anode electrode having each interface between the spacer and electrodes coated with amorphous diamond. An exposed side of the cathode is further coated with carbon black to absorb heat. The spacer is used to maximize the electrical conductance and thermal resistance by varying the composition and thickness. The two electrodes are made by screen printing silver grease on PET plastic such that the entire device is flexible. The spacer can be barium titanate, PZT, $Bi_2Te_3$, a mixture of graphite and hexagonal boron nitride, or alumina impregnated aluminium.

When one side of the cathode is heated to about 100° C., electricity is generated between these two electrodes. The voltage of the electricity increases with the resistance of the spacer; and the current varies with the conductance. The heat to electricity conversion efficiency also increases with the thermal resistance of the spacer. In the above design, no electricity is generated if the amorphous diamond coating is not applied to at least one electrode.

As an illustration of the principles of the present invention, the same device can be connected to a battery. In this case, the cathode becomes colder than the anode due to the applied driving force of electrons away from the cathode. This electrical cooling effect can be used as either a heat spreader for removing heat from a hot surface or as the chilling device as in a cooling box.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A diamond-like carbon thermoelectric conversion device, comprising:
   a) a first electrode having a base member with a layer of diamond-like carbon material coated over at least a portion thereof;
   b) a continuous solid intermediate member electrically coupled to the diamond-like carbon material, said intermediate member including a dielectric material which supports a voltage from about 0.1 V to about 6 V across the intermediate member; and
   c) a second electrode electrically coupled to the intermediate member opposite the diamond-like carbon material.

2. The device of claim 1, wherein the first electrode is a cathode and the base member comprises at least two layers.

3. The device of claim 2, wherein the base member comprises a first conductive cathode layer and a second layer, said second layer having a work function less than a work function of the first conductive cathode layer.

4. The device of claim 3, wherein the second layer comprises a member selected from the group consisting of Cs, Sm, Al—Mg, Li, Na, K, Rb, Be, Mg, Ca, Sr, Ba, B, Ce, Al, La, Eu, and mixtures or alloys thereof.

5. The device of claim 1, wherein the first electrode is an anode.

6. The device of claim 1, wherein the intermediate member has a thermal conductivity less than about 200 W/mK.

7. The device of claim 1, wherein the intermediate member has a thickness from about 0.2 µm to about 100 µm.

8. The device of claim 1, wherein the dielectric material is a polymer, a glass, a ceramic, graphite, or a mixture or composite thereof.

9. The device of claim 1, wherein the dielectric material is a member selected from the group consisting of $BaTiO_3$, PZT, $Ta_2O_3$, PET, $PbZrO_3$, $PbTiO_3$, NaCl, LiF, MgO, $TiO_2$, $Al_2O_3$, BaO, KCl, $Mg_2SO_4$, fused silica glass, soda lime silica glass, high lead glass, graphite, hexagonal boron nitride, metal matrix composite, reverse metal matrix composite, BiSb, $Bi_2T_{23}$, PbTe, SiGe, $Bi_2Te_3$, $Zn_4Sb_3$, $La_2Te_3$, and mixtures, composites or combinations thereof.

10. The device of claim 9, wherein the dielectric material comprises graphite and hexagonal boron nitride.

11. The device of claim 1, wherein the first electrode and the second electrode are flexible.

12. The device of claim 1, wherein the diamond-like carbon material is amorphous carbon.

13. The device of claim 1, wherein the diamond-like carbon material has a thickness from about 10 nanometers to about 3 microns.

14. The device of claim 1, wherein the diamond-like carbon material includes at least about 80% carbon atoms with at least about 20% of said carbon atoms being bonded with distorted tetrahedral coordination.

15. The device of claim 1, further comprising an energy collector coupled to the first electrode opposite the diamond-like carbon material such that the diamond-like carbon thermoelectric conversion device is configured as an electrical generator.

16. The device of claim 1, further comprising a voltage source operatively connected between the second electrode and the first electrode such that the diamond-like carbon thermoelectric conversion device is configured as a cooling device.

17. A method of making a diamond-like carbon thermoelectric conversion device as recited in claim 1, comprising:
   a) forming the layer of diamond-like carbon material on the first electrode using a vapor deposition technique, said diamond-like carbon material having an electron emission surface opposite the first electrode;
   b) forming the intermediate member on the electron emission surface; and
   c) coupling the second electrode to the intermediate member opposite the first electrode.

18. The method of claim 17, wherein the step of forming the layer of diamond-like carbon material includes physical vapor deposition.

19. The method of claim 17, wherein the step of forming the intermediate member includes vapor deposition, thin film deposition, preformed solid, powdered layer, or screen printing.

20. The method of claim 17, further comprising forming an energy collection layer on the first electrode opposite the diamond-like carbon material.

21. The method of claim 17, further, comprising subjecting the diamond-like carbon thermoelectric conversion device to a heat treatment to consolidate interfacial boundaries and reduce material defects.

22. A method of generating an electrical current, comprising inputting an amount of photonic or thermal energy into an energy input surface of the diamond-like carbon thermoelectric conversion device of claim 1, which is sufficient to produce a current, said energy input surface being on the first electrode opposite the diamond-like carbon material.

23. The method of claim 22, wherein said photonic or thermal energy is sufficient to maintain the first electrode at a temperature from about 100° C. to about 1800° C.

* * * * *